United States Patent
Hasegawa et al.

(10) Patent No.: US 11,604,307 B1
(45) Date of Patent: Mar. 14, 2023

(54) DARK MIRROR OPTICAL STACK AND RELATED SYSTEMS

(71) Applicant: United States of America as represented by the Administrator of NASA, Washington, DC (US)

(72) Inventors: Mark Hasegawa, Greenbelt, MD (US); George Harris, Greenbelt, MD (US); Nithin Abraham, Greenbelt, MD (US); Christine Cottingham, Greenbelt, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 741 days.

(21) Appl. No.: 16/580,247

(22) Filed: Sep. 24, 2019

(51) Int. Cl.
*G02B 5/00* (2006.01)
*G02B 1/10* (2015.01)
*C23C 14/20* (2006.01)
*C23C 14/10* (2006.01)

(52) U.S. Cl.
CPC ............... *G02B 5/003* (2013.01); *G02B 1/10* (2013.01); *C23C 14/10* (2013.01); *C23C 14/20* (2013.01)

(58) Field of Classification Search
CPC .......... G02B 5/003; G02B 1/10; C23C 14/10; C23C 14/20
See application file for complete search history.

(56) References Cited

U.S. PATENT DOCUMENTS

| | | | | |
|---|---|---|---|---|
| 4,975,762 A | * | 12/1990 | Stradley | H01L 23/556 257/702 |
| 5,808,714 A | * | 9/1998 | Rowlands | G02F 1/133512 349/110 |
| 5,837,354 A | * | 11/1998 | Ogisu | C23C 14/20 428/209 |
| 6,118,968 A | * | 9/2000 | Schlueter, Jr. | G03G 15/162 428/419 |
| 2004/0197527 A1 | * | 10/2004 | Maula | C23C 16/45555 428/172 |
| 2011/0070742 A1 | * | 3/2011 | Chih-Chang | H01L 21/76816 438/712 |
| 2014/0127513 A1 | * | 5/2014 | Nakajima | C08L 79/08 264/312 |
| 2014/0362434 A1 | * | 12/2014 | Schmitz | B32B 17/10761 427/125 |
| 2014/0370700 A1 | * | 12/2014 | Tong | H01L 21/32115 438/589 |

(Continued)

*Primary Examiner* — Kristina M Deherrera
*Assistant Examiner* — Sharrief I Broome
(74) *Attorney, Agent, or Firm* — Matthew F. Johnston; Trenton J. Roche

(57) ABSTRACT

A dark mirror optical stack, particularly a low emittance, high absorbance dark mirror optical stack is provided. The dark mirror optical stack includes a polyimide substrate containing carbon filler, an aluminum layer on the polyimide substrate, a first silicon oxide layer on the aluminum layer, a chromium layer on the first silicon oxide layer, and a second silicon oxide layer on the chromium layer. In a particularly exemplary embodiment, the aluminum layer has an average thickness of 600 to 2000 Angstroms, the first and second silicon oxide layers have average thicknesses of 500 to 1000 Angstroms, and the chromium layer has an average thickness of 40 to 100 Angstroms.

19 Claims, 1 Drawing Sheet

(56) References Cited

U.S. PATENT DOCUMENTS

Figure 1:
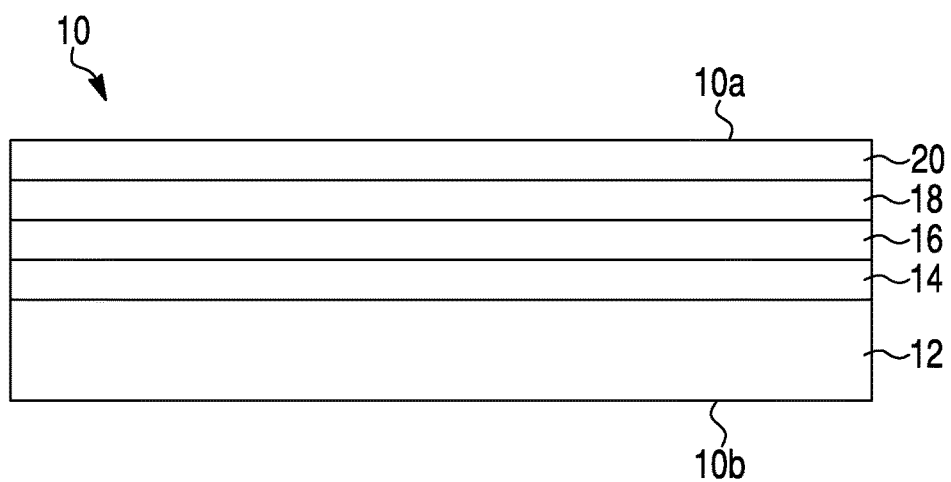

| | | | |
|---|---|---|---|
| 2015/0286073 A1* | 10/2015 | Blum | G02C 7/101 |
| | | | 359/241 |
| 2016/0090292 A1* | 3/2016 | Ni | B81C 1/0015 |
| | | | 438/52 |
| 2016/0163451 A1* | 6/2016 | Wang | H01F 27/2804 |
| | | | 336/200 |
| 2019/0064407 A1* | 2/2019 | Krogman | B32B 17/10779 |
| 2019/0099979 A1* | 4/2019 | Bee | B32B 1/00 |
| 2019/0198346 A1* | 6/2019 | Cheng | H01L 21/2636 |
| 2020/0158913 A1* | 5/2020 | Chang | G02C 7/04 |
| 2020/0247016 A1* | 8/2020 | Calafiore | C23C 16/40 |
| 2020/0284957 A1* | 9/2020 | Bellos | G01N 21/648 |

* cited by examiner

DARK MIRROR OPTICAL STACK AND RELATED SYSTEMS

ORIGIN OF THE INVENTION

The invention described herein was made in the performance of work under a NASA contract and by an employee of the United States Government and is subject to the provisions of Section 305 of the National Aeronautics and Space Act of 1958, Public Law 85-568 (72 Stat. 435; 42 U.S.C. 2457), and may be manufactured and used by or for the Government for governmental purposes without the payment of any royalties thereon or therefor.

FIELD OF THE INVENTION

The present invention relates to dark mirror optical stacks, and to optical systems including the same, especially optical systems where thermal radiative isolation and high visible light absorption are required. The present invention also involves related methods, such as making the dark mirror optical stacks and applying the dark mirror optical stacks to a device, instrument, or other surface.

BACKGROUND

Optical instruments and sensors often include cavities, apertures, and other regions along which light travels to an optically active area. Surface areas surrounding the optical active area are sometimes covered with materials that are optically absorptive in nature so as to limit, or more preferably prevent, stray light from reflecting off those surface areas into the optically active area. The reduction of reflecting stray light reduces or eliminates crosstalk and improves system signal-to-noise ratio, thereby improving the performance of the optical instrument, sensor, or other device.

The materials used in these surrounding surface areas are selected to absorb at the light wavelengths of interest, often including at least the visible light spectrum. Such materials included "dark mirrors," which, as derived from their name, have the characteristic of providing a dark, and sometimes black, appearance. Dark mirrors are configured to absorb light and reduce reflection of light (that is, are anti-reflective) in a specific spectral bandwidth, for example, wavelengths within the visible light spectrum, as well as typically within the near-infrared (IR) spectrum, and optionally within the near-UV spectrum. Generally, dark mirrors are anti-reflective and have high emissivity (i.e., radiation of energy) in the visible and near-IR spectral bandwidth.

Temperature control of surfaces within these light paths and cavities can rely on heat transport through thermal radiation. Surface IR emittance properties of a material controls the amount of heat transported between surfaces. The lower the IR emittance, the lower the heat transport. Thus, within the optical cavities and other surface areas on or around which dark mirrors are used, coatings with low emittance at or below room temperature (i.e., a poor thermal emitter) in the IR range (e.g., 3,000 to 35,000 nm) are desired. Aluminum and gold are examples of materials having low IR emittance. However, aluminum and gold can be extremely specular, that is, highly reflective in the visible light spectrum instead of being absorptive. It would be ideal to provide a dark mirror that has low emissivity in the IR range and high absorptance in the visible and near-IR ranges.

Additionally, coated surfaces of optical trains or cavities desirably meet electrical charge dissipation requirements to prevent charge buildup and electrostatic discharge events. Satisfying charge dissipation requirements typically involves construction of a durable bleed path. Conventionally, conductive paints may provide bleed paths to electrostatic discharge events. However, the conductive paints do not have proper optical thermal properties for dark mirror applications. In particular, conductive paints typically have high absorbance in the infrared range.

Previous coatings have used darkened nickel or other metallic coatings on foils to achieve low emittance and high solar absorptance system. However, these coatings may no longer be available or may not be available much longer, and do not always perform as well as desired.

SUMMARY OF THE INVENTION

According to a first aspect of the invention, a dark mirror optical stack includes a polyimide substrate containing a carbon filler, an aluminum layer on the polyimide substrate, a first silicon oxide layer on the aluminum layer, a chromium layer on the first silicon oxide layer, and a second silicon oxide layer on the chromium layer.

A second aspect of the invention is a dark mirror optical stack including an oxygen plasma treated polyimide substrate containing a carbon filler, an aluminum layer on the oxygen plasma treated polyimide substrate having an average thickness in a range of 600 Angstroms to 2000 Angstroms and a purity of at least 99 weight percent aluminum, a first silicon oxide layer on the aluminum layer having an average thickness in a range of 500 Angstroms to 1000 Angstroms and a purity of at least 99 weight percent silicon oxide, a chromium layer on the first silicon oxide layer having an average thickness in a range of 40 Angstroms to 100 Angstroms and a purity of at least 99 weight percent chromium, and a second silicon oxide layer on the chromium layer having an average thickness in a range of 500 Angstroms to 1000 Angstroms and a purity of at least 99 weight percent silicon oxide.

A third aspect of the invention is a dark mirror optical stack including an oxygen plasma treated polyimide substrate containing a carbon filler, an aluminum layer on the oxygen plasma treated polyimide substrate having an average thickness in a range of 700 Angstroms to 1200 Angstroms and a purity of at least 99 weight percent aluminum, a first silicon oxide layer on the aluminum layer having an average thickness in a range of 600 Angstroms to 800 Angstroms and a purity of at least 99 weight percent silicon oxide, a chromium layer on the first silicon oxide layer having an average thickness in a range of 60 Angstroms to 80 Angstroms and a purity of at least 99 weight percent chromium, and a second silicon oxide layer on the chromium layer having an average thickness in a range of 600 Angstroms to 800 Angstroms and a purity of at least 99 weight percent silicon oxide.

According to an exemplary embodiment of each of the above aspects of the invention, the polyimide substrate has an average thickness in a range of 1 mil to 3 mil.

According to another exemplary embodiment of each of the above aspects of the invention, the carbon filler of the polyimide substrate comprises graphite.

According to a further exemplary embodiment of each of the above aspects of the invention, the dark mirror optical stack has a solar absorbance of at least 0.88 (that is, at least 88 percent), more preferably at least 0.90 (that is, at least 90 percent) across a light wavelength range of 250 nm to 2500 nm, as measured by a spectrophotometer.

According to still another exemplary embodiment of each of the above aspects of the invention, the dark mirror optical stack has a low room temperature emissivity of 0.01 to 0.07 (that is, 1 percent to 7 percent), more preferably a low room temperature emissivity of 0.01 to 0.03 (that is, 1 to 3 percent, in a light wavelength range of 3,000 nm to 35,000 nm, as measured by an infrared spectrometer, such as a DB-100 Infrared Reflectometer.

Other aspects of the invention, including apparatus, devices, systems, structures, processes, and the like which constitute part of the invention, will become more apparent upon reading the following detailed description of the exemplary embodiments.

BRIEF DESCRIPTION OF THE DRAWING(S)

Figure 2:
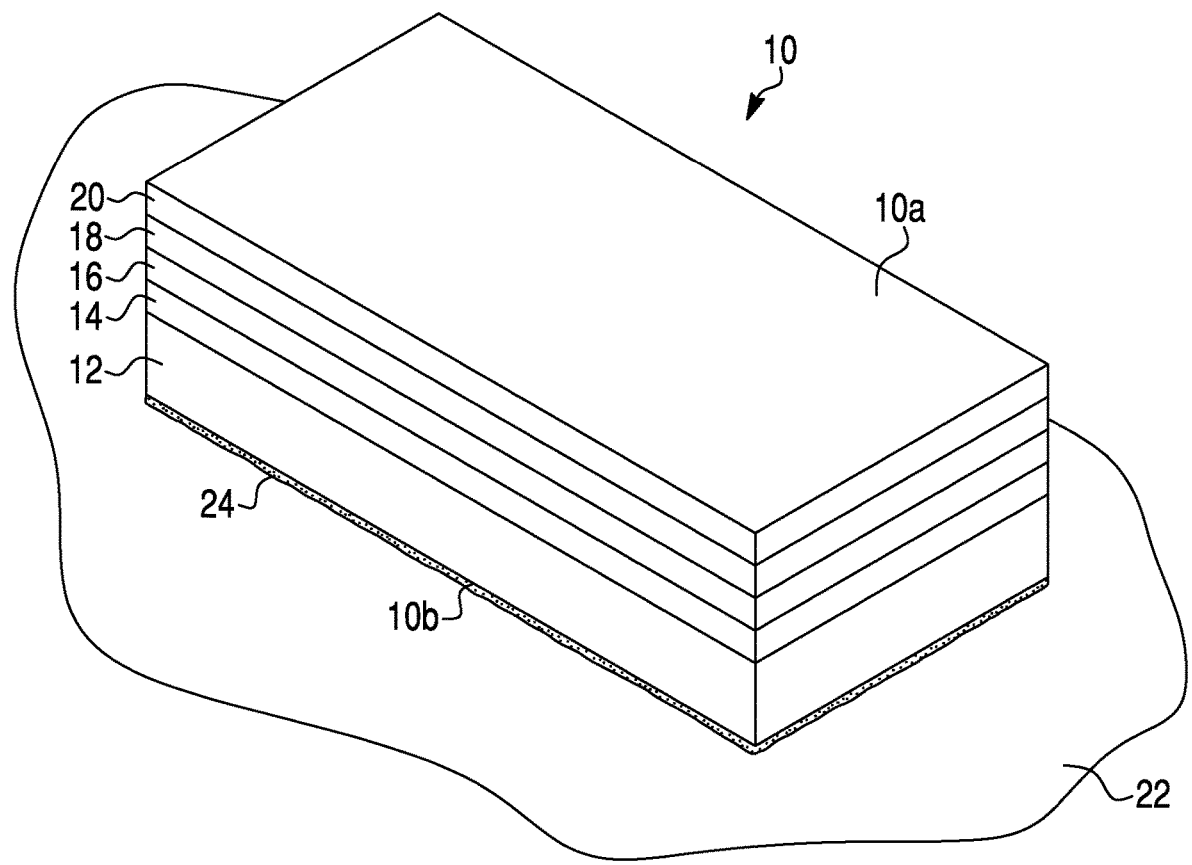

The accompanying drawings are incorporated in and constitute a part of the specification. The drawings, together with the general description given above and the detailed description of the exemplary embodiments and methods given below, serve to explain the principles of the invention. In such drawings:

FIG. 1 is a side sectional view of a dark mirror optical stack according to an exemplary embodiment of the invention; and FIG. 2 is a perspective view of the dark mirror optical stack of FIG. 1 applied to a surface.

DETAILED DESCRIPTION OF THE EXEMPLARY EMBODIMENTS AND EXEMPLARY METHODS

Reference will now be made in detail to exemplary embodiments and methods of the invention. It should be noted, however, that the invention in its broader aspects is not necessarily limited to the specific details, representative materials and methods, and illustrative examples shown and described in connection with the exemplary embodiments and methods.

Exemplary embodiments of the invention relate to a dark mirror optical stack comprising a durable low IR emittance, highly (visible light) absorptive coating system (or "coating") on a carbon loaded (or carbon doped) polyimide substrate preferably embodied as a film or tape, that has electrostatic discharge bleed off characteristics as well as variable diffusivity as a function of surface roughness, which is influenced by the substrate composition. In exemplary embodiments, the dark mirror optical stack has low IR emittance properties, preferably as low as that of aluminum, while strongly absorbing light through the visible light spectrum and preferably into the low-IR spectrum. The new technology has multiple applications, including in optical systems and for optical sensors where thermal radiative isolation and light absorption are desired or required.

A dark mirror optical stack according to an exemplary embodiment of the invention is generally designated by reference numeral 10 in the accompanying FIGS. 1 and 2. The dark mirror optical stack 10 shown in FIGS. 1 and 2 is not to scale. The dark mirror optical stack 10 has an exterior surface 10a, which in an outer space environment typically is the space-facing side of the dark mirror optical stack 10, and an opposite interior surface 10b that typically attaches to the surface to be protected, such as the optical instrument, sensor, helmet, or other surface.

The dark mirror optical stack 10 comprises (or optionally consists essentially of or consists of) a carbon-containing (or carbon doped) polyimide substrate 12, an aluminum layer 14 over at least part of the polyimide substrate 12, a first silicon oxide layer 16 over at least part of the aluminum layer 14, a chromium layer 18 over at least part of the first silicon oxide layer 16, and a second silicon oxide layer 20 over at least part of the chromium layer 18.

The polyimide substrate 12 includes one or more carbon fillers, and principally acts as a durable charge bleed path for any charge buildup on the surface of the dark mirror optical stack 10. Various different types of carbon filled/loaded polyimide of different thicknesses can provide different optical properties as well as diffusivities at different wavelengths, and can be appropriately chosen by those skilled in the art having reference to this disclosure based upon the system requirements. The polyimide substrate 12 preferably has a thickness within a range of about 1 mil (0.001 inch or 0.0254 mm) to about 3 mil (0.003 inch or 0.0762 mm), although thicknesses outside of this range may be practiced. The carbon filler can be, for example, graphite. Excellent examples of polyimide substrates in the form of films containing carbon filler are Kapton® polyimide films available from DuPont of Wilmington, Del., USA, including Black Kapton® XC 2.75 mil film and 100 E7 Black Kapton1 mil tape.

The polyimide substrate 12 preferably has a surface roughness to reduce specularity. The smoother the surface of the polyimide substrate 12, the higher the specularity will be, whereas the rougher the surface of the polyimide substrate 12, the lower the specularity will be. For example, the optical roughness of the polyimide substrate 12 may be determined by the bidirectional reflectance distribution function (BRDF) model. The carbon-filler-containing polyimide substrate 12 preferably is subject to oxygen plasma treatment, which can change the surface texture and specularity of the polyimide substrate 12 by making the surface texture rougher and thus higher in specularity. An example of a suitable plasma treatment involves 20 to 45 minutes of exposure at approximately 2 KV to 3 KV potential and pressure at $5 \times 10^{-3}$ torr and power settings of 100 mA to 150 mA at 2 KV to 3 KV. A proper balance of vacuum to oxygen may change depending on the particular system used, but is within the purview of a person skilled in the art having reference to this disclosure.

The aluminum layer 14 is formed on, preferably directly on and in physical contact with, the carbon-containing polyimide substrate 12, and preferably is co-extensive with the polyimide substrate 12 so as to extend to the edges of the polyimide substrate 12. The aluminum layer 14 preferably has a high aluminum purity, preferably at least about 99 weight percent, still more preferably at least 99.99 weight percent. The aluminum layer 14 may be made, for example, by physical vapor deposition (PVD) in a vacuum deposition chamber. The PVD process may involve placing the high purity (e.g., 99.99% or higher) aluminum source on a tungsten filament (e.g., an aluminum wire wrapped about the tungsten filament), melting and vaporizing the aluminum, and allowing the aluminum to deposit on the polyimide substrate 12. The vacuum deposition chamber may be set at a pressure of, for example, $5 \times 10^{-6}$ torr or less, for this and other PVD process steps described herein. The PVD may cause the deposited layer, here the aluminum layer 14 on the polyimide substrate 12, to be non-uniform thickness, more specifically to have a slightly greater thickness near its center than about its periphery. For this reason, thicknesses of the layers 14, 16, 18, and 20 discussed herein are referred to by their average thicknesses. The average thickness of the aluminum layer 14 preferably is in a range of 600 Angstroms to 2000 Angstrom (A), more preferably in a range of 600

Angstroms to 1200 Angstroms, and still more preferably in a range of 700 Angstroms to 1200 Angstroms.

The first silicon oxide layer 16 is formed on, preferably directly on and in physical contact with, the aluminum layer 14, and preferably is co-extensive with the aluminum layer 14 so as to extend to the edges of the aluminum layer 14. The first silicon oxide layer 16 preferably has a high silicon oxide (silicon monoxide) purity, preferably at least about 99 weight percent, still more preferably above 99.99 weight percent. Like the aluminum layer 14, the first silicon oxide layer 16 may be formed by a PVD process. The average thickness of the first silicon oxide layer 16 preferably is in a range of 500 Angstroms to 1000 Angstroms, more preferably in the range of 600 Angstroms to 800 Angstroms.

The chromium or chrome layer 18 is formed on, preferably directly on and in physical contact with, the first silicon oxide layer 16, and preferably is co-extensive with the first silicon oxide layer 16 so as to extend to the edges of the first silicon oxide layer 16. The chromium layer 18 preferably has a high chromium purity, preferably at least about 99 weight percent, still more preferably above 99.99 weight percent. The chromium layer 18 may be formed by a PVD process. The average thickness of the chromium layer 18 preferably is in a range of 40 Angstroms to 100 Angstroms, more preferably in the range of 60 Angstroms to 80 Angstroms.

The second silicon oxide layer 20 is formed on, preferably directly on and in physical contact with, the chromium layer 18, and preferably is co-extensive with the chromium layer 18 so as to extend to the edges of the chromium layer 18. The second silicon oxide layer 20 preferably has a high silicon oxide (silicon monoxide) purity, preferably at least about 99 weight percent, still more preferably above 99.99 weight percent. Like the aluminum layer 14, the second silicon oxide layer 20 may be formed by a PVD process. The average thickness of the second silicon oxide layer 20 preferably is in a range of 500 Angstroms to 1000 Angstroms, more preferably in the range of 600 Angstroms to 800 Angstroms. The average thicknesses of the first and second silicon oxide layers 16 and 20 may be the same or different than one another.

The substrate 12 and the coating layers 14, 16, 18, and 20 of the dark mirror optical stack 10 are desirably selected to allow for destructive interference of visible light and near-IR light striking the exterior surface 10*a* surface, which significantly reduces the reflectance of the dark mirror optical stack 10. The dark mirror optical stack 10 preferably has absorbances of at least 0.90±0.02 (error due to instrument uncertainty), that is, 90 percent±2 percent absorption, across a light wavelength range of 500 nm to 2,000 nm, more preferably across a light wavelength range of 250 nm to 2500 nm, as measured by a spectrophotometer using a diffuse standard baseline (as opposed a specular standard baseline).

At the same time, the dark mirror optical stack 10 preferably allows for low emissivity of light across the light wavelength range of 5,000 nm to 20,000 nm. The dark mirror optical stack 10 preferably has a low IR emissivity, nearing that of 0.01 to 0.07 (that is, 1 percent to 7 percent), more preferably 0.02 to 0.05 (that is, 1 to 5 percent), as a measurement of the reflectance at wavelengths across a range of 4 microns and 40 microns.

These properties may be significant for optical designs that require extremely black coatings in the visible light spectrum. Tailoring concentrations and thicknesses of the component parts (e.g., substrate and layers/coatings) of the dark mirror optical stack 10 may affect IR emittance and visible light absorptance properties. For example, a higher carbon content polyimide substrate 12 (e.g., XC Kapton film) has greater absorptance properties in the visible range, possibly 1-2% higher, but yields emittance values 1-3% higher, compared to glass.

Additionally, the dark mirror optical stack 10 preferably also has high charge dissipation characteristics to prevent charge buildup and electrostatic discharge events. For example, the surface resistance of the dark mirror optical stack 10 preferably is less than $10^9$ ohm/sq, more preferably in a range of $1\times10^3$ ohm/sq to $1\times10^9$ ohm/square. or of $10^9$ ohms/square. These charge dissipation preferences involve construction of a durable bleed path.

Thus, in particularly preferred embodiments the dark mirror optical stack 10 results in reduced specularity to help control stray light in baffled systems, low emissivity in the IR range to control heat transport, and an effective way to bleed charge on a durable film.

In the above exemplary embodiments, the various layers 14, 16, 18, and 20 are formed by a PVD technique. It should be understood that alternative techniques may be used.

The coating layers 14, 16, 18, and 20 of the dark mirror optical stack 10 may be formed on the substrate 12, for example in a PVD chamber, and thereafter the dark mirror optical stack 10 can be transferred and applied to the devices, systems, instruments, objects, equipment, and other surfaces. FIG. 2 shows the dark mirror optical stack 10 applied to a surface 22 using an adhesive 24 between the surface 22 and the interior surface 10*b*. For example, adhesives (conductive or nonconductive) adhesives have been found to be exemplary for joining, attaching, securing, etc. the dark mirror optical stack 10 devices, systems, instruments, objects, equipment, and other surfaces. One example of a nonconductive adhesive is 3M® Adhesive Transfer Tape 966, which is reported to include high temperature acrylic adhesive. Low outgassing silicone adhesives such as CV-2566 from Nusil Corporation or epoxy-based systems such as Henkel Hysol EA 9394 may be used to bond the dark mirror optical stack to a surface. An example of a conductive adhesive is 3M Adhesive Transfer Tape 97057. Mechanical fasteners or other types of joining parts may be used instead of or in addition to adhesive. Alternatively, the coating layers of the dark mirror optical stack 10 may be formed directly on the heating devices, optical systems, or other equipment or surfaces, e.g., in a PVD chamber.

The dark mirror optical stack 10 embodied herein may be useful, for example, in solar heating devices that are embedded in a vacuum system. The low emittance value will keep the system from heat loss through radiation and the high solar absorptance will allow rapid solar heating. Other applications for the dark mirror optical stack 10 include, without limitation, heating devices, optical systems, astronaut helmets, or other equipment, systems, instruments, objects, and surfaces.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. The various components and features of the above-described exemplary embodiments may be substituted into one another in any combination. It is within the scope of the invention to make the modifications necessary or desirable to incorporate one or more components and features of any one embodiment into any other embodiment.

As used herein, the terms "comprises," "comprising," "includes," "including," "contain," "containing," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any claim.

The foregoing detailed description of the certain exemplary embodiments has been provided for the purpose of explaining the principles of the invention and its practical application, thereby enabling others skilled in the art to understand the invention for various embodiments and with various modifications as are suited to the particular use contemplated. One of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

What is claimed is:

1. A dark mirror optical stack, comprising:
   a polyimide substrate comprising a carbon filler;
   an aluminum layer on the polyimide substrate;
   a first silicon oxide layer on the aluminum layer;
   a chromium layer on the first silicon oxide layer; and
   a second silicon oxide layer on the chromium layer;
   wherein the dark mirror optical stack has a solar absorbance of at least 0.88 across a light wavelength range of 250 nm to 2500 nm, as measured by a spectrophotometer.

2. The dark mirror optical stack of claim 1, wherein the polyimide substrate has an average thickness in a range of 1 mil to 3 mil.

3. The dark mirror optical stack of claim 1, wherein the polyimide substrate comprises an oxygen plasma treated polyimide substrate.

4. The dark mirror optical stack of claim 1, wherein the carbon filler of the polyimide substrate comprises graphite.

5. The dark mirror optical stack of claim 1, wherein the aluminum layer has an average thickness in a range of 600 Angstroms to 2000 Angstrom.

6. The dark mirror optical stack of claim 1, wherein the aluminum layer has an average thickness in a range of 700 Angstroms to 1200 Angstroms.

7. The dark mirror optical stack of claim 1, wherein the aluminum layer has a purity, of at least 99 weight percent aluminum.

8. The dark mirror optical stack of claim 1, wherein the first and second silicon oxide layers have respective average thicknesses in a range of 500 Angstroms to 1000 Angstroms.

9. The dark mirror optical stack of claim 1, wherein the first and second silicon oxide layer have respective average thickness in a range of 600 Angstroms to 800 Angstroms.

10. The dark mirror optical stack of claim 1, wherein the first and second silicon oxide layer each have a purity of at least 99 weight percent silicon oxide.

11. The dark mirror optical stack of claim 1, wherein the chromium layer has an average thickness in a range of 40 Angstroms to 100 Angstroms.

12. The dark mirror optical stack of claim 1, wherein the chromium layer has an average thickness in a range of 60 Angstroms to 80 Angstroms.

13. The dark mirror optical stack of claim 1, wherein the chromium layer has a purity of at least 99 weight percent chromium.

14. The dark mirror optical stack of claim 1, wherein the dark mirror optical stack has a room temperature emissivity in a range of 0.01 to 0.07 across a light wavelength range of 3,000 nm to 35,000 nm, as measured by an infrared spectrometer.

15. A dark mirror optical stack, comprising:
   an oxygen plasma treated polyimide substrate comprising a carbon filler;
   an aluminum layer on the polyimide, substrate, the aluminum layer having an average thickness in a range of 600 Angstroms to 2000 Angstroms and a purity of at least 99 weight percent aluminum;
   a first silicon oxide layer on the aluminum layer having an average thickness in a range of 500 Angstroms to 1000 Angstroms and a purity of at least 99 weight percent silicon oxide;
   a chromium layer on the first silicon oxide layer having an average thickness in a range of 40 Angstroms to 100 Angstroms and a purity of at least 99 weight percent chromium; and
   a second silicon oxide layer on the chromium layer having an average thickness in a range of 500 Angstroms to 1000 Angstroms and a purity of at least 99 weight percent silicon oxide.

16. The dark mirror optical stack of claim 15, wherein the dark mirror optical stack has a solar absorbance of at least 0.88 across a light wavelength range of 250 nm to 2500 nm, as measured by a spectrophotometer.

17. The dark mirror optical stack of claim 16, wherein the dark mirror optical stack has a room temperature emissivity in a range of 0.01 to 0.07 across a light wavelength range of 3,000 nm to 35,000 nm, as measured by an infrared spectrometer.

18. A dark mirror optical stack, comprising:
   an oxygen plasma treated polyimide substrate comprising a Carbon filler;
   an aluminum layer on the polyimide substrate, the aluminum layer having an average thickness in a range of 700 Angstroms to 1200 Angstroms and a purity of at least 99 weight percent aluminum;
   a first silicon oxide layer on the aluminum layer having an average thickness in a range of 600 Angstroms to 800 Angstroms and a purity of at least 99 weight percent silicon oxide;
   a chromium layer on the first silicon oxide layer having an average thickness in a range of 60 Angstroms to 80 Angstroms and a purity of at least 99 weight percent chromium; and
   a second silicon oxide layer on the chromium layer having an average thickness in a range of 600 Angstroms to 800 Angstroms and a purity of at least 99 weight percent silicon oxide.

19. The dark mirror optical stack of claim 18, wherein the dark mirror optical stack has a solar absorbance of at least 0.88 across a light wavelength range of 250 nm to 2500 nm, as measured by a spectrophotometer, and a room temperature emissivity in a range of 0.01 to 0.07 across a light wavelength range of 13.000 nm to 35,000 nm, as measured by an infrared spectrometer.

* * * * *